(12) United States Patent
Sakai

(10) Patent No.: US 8,198,645 B2
(45) Date of Patent: Jun. 12, 2012

(54) SEMICONDUCTOR LIGHT EMITTING DEVICE AND METHOD FOR MANUFACTURING THE SAME

(75) Inventor: Mitsuhiko Sakai, Kyoto (JP)

(73) Assignee: Rohm Co., Ltd., Kyoto-fu (JP)

( * ) Notice: Subject to any disclaimer, the term of this patent is extended or adjusted under 35 U.S.C. 154(b) by 161 days.

(21) Appl. No.: 12/086,177

(22) PCT Filed: Dec. 7, 2006

(86) PCT No.: PCT/JP2006/324436
§ 371 (c)(1),
(2), (4) Date: Jun. 6, 2008

(87) PCT Pub. No.: WO2007/066716
PCT Pub. Date: Jun. 14, 2007

(65) Prior Publication Data
US 2009/0278145 A1  Nov. 12, 2009

(30) Foreign Application Priority Data
Dec. 9, 2005  (JP) ................................ P2005-356800

(51) Int. Cl.
*H01L 33/00* (2010.01)
(52) U.S. Cl. .................. 257/98; 257/103; 257/E33.067; 257/E33.074; 438/29; 438/46
(58) Field of Classification Search ........................ 257/98
See application file for complete search history.

(56) References Cited

U.S. PATENT DOCUMENTS

| | | | | |
|---|---|---|---|---|
| 5,132,751 A | * | 7/1992 | Shibata et al. ................ | 257/93 |
| 5,779,924 A | * | 7/1998 | Krames et al. ................ | 216/24 |
| 5,889,295 A | * | 3/1999 | Rennie et al. ................ | 257/96 |
| 6,009,112 A | * | 12/1999 | Uchida ................ | 372/46.01 |
| 6,015,979 A | * | 1/2000 | Sugiura et al. ................ | 257/86 |
| 6,084,899 A | * | 7/2000 | Shakuda ................ | 372/45.01 |
| 6,249,372 B1 | * | 6/2001 | Kobayashi et al. ........... | 359/326 |
| 6,329,667 B1 | * | 12/2001 | Ota et al. ................ | 257/13 |
| 6,355,945 B1 | * | 3/2002 | Kadota et al. ................ | 257/82 |
| 6,441,403 B1 | * | 8/2002 | Chang et al. ................ | 257/94 |
| 6,525,345 B1 | * | 2/2003 | Kadota ................ | 257/94 |
| 6,535,536 B2 | * | 3/2003 | Fukunaga et al. ......... | 372/45.01 |
| 6,555,846 B1 | * | 4/2003 | Watanabe et al. ................ | 257/94 |
| 6,627,521 B2 | * | 9/2003 | Furukawa et al. ............ | 438/481 |

(Continued)

FOREIGN PATENT DOCUMENTS

JP  10-163525  6/1998

(Continued)

*Primary Examiner* — N Drew Richards
*Assistant Examiner* — Ankush Singal
(74) *Attorney, Agent, or Firm* — Rabin & Berdo, P.C.

(57) ABSTRACT

To provide a semiconductor light emitting device with a light extraction efficiency increased and a method for manufacturing the semiconductor light emitting device.

A semiconductor light emitting device 1 includes a supporting substrate 2 and a semiconductor stack 6 including an MQW active layer 13 emitting light and an n-GaN layer 14 at the top. In the upper surface of the n-GaN layer 14 of the semiconductor attack 6, a plurality of conical protrusions 14*a* are formed. The protrusions 14*a* are formed so that an average $W_A$ of widths W of bottom surfaces of protrusions 14 satisfies: $W_A \geq \lambda/n$, where $\lambda$ is wavelength of light emitted from the active layer and n is a refractive index of the n-GaN layer 14.

6 Claims, 5 Drawing Sheets

U.S. PATENT DOCUMENTS

| | | | |
|---|---|---|---|
| 6,735,230 B1* | 5/2004 | Tanabe et al. | 372/43.01 |
| 6,753,643 B2* | 6/2004 | Wilson | 313/309 |
| 6,791,117 B2* | 9/2004 | Yoshitake et al. | 257/94 |
| 6,836,498 B2* | 12/2004 | Takeya et al. | 372/45.01 |
| 6,855,571 B1* | 2/2005 | Sugahara et al. | 438/46 |
| 6,900,473 B2* | 5/2005 | Yoshitake et al. | 257/95 |
| 7,294,866 B2* | 11/2007 | Liu | 257/100 |
| 7,476,910 B2* | 1/2009 | Fujimoto et al. | 257/95 |
| 7,504,667 B2* | 3/2009 | Fujikura et al. | 257/98 |
| 2003/0062531 A1* | 4/2003 | Furukawa et al. | 257/79 |
| 2003/0075723 A1* | 4/2003 | Heremans et al. | 257/98 |
| 2003/0122478 A1* | 7/2003 | Suehiro et al. | 313/498 |
| 2003/0132445 A1* | 7/2003 | Yoshitake et al. | 257/84 |
| 2003/0178626 A1* | 9/2003 | Sugiyama et al. | 257/79 |
| 2003/0218179 A1* | 11/2003 | Koide et al. | 257/95 |
| 2004/0077114 A1* | 4/2004 | Coman et al. | 438/46 |
| 2004/0080011 A1* | 4/2004 | Starikov et al. | 257/481 |
| 2004/0129929 A1* | 7/2004 | Okuyama et al. | 257/10 |
| 2004/0188689 A1* | 9/2004 | Shono et al. | 257/79 |
| 2005/0205127 A1* | 9/2005 | Watanabe et al. | 136/255 |
| 2005/0236630 A1* | 10/2005 | Wang | 257/80 |
| 2005/0279994 A1* | 12/2005 | Ueda et al. | 257/33 |
| 2006/0027815 A1* | 2/2006 | Wierer et al. | 257/79 |
| 2006/0091408 A1* | 5/2006 | Kim et al. | 257/94 |
| 2006/0273335 A1* | 12/2006 | Asahara et al. | 257/98 |
| 2007/0029541 A1* | 2/2007 | Xin et al. | 257/14 |
| 2007/0121690 A1* | 5/2007 | Fujii et al. | 372/43.01 |

FOREIGN PATENT DOCUMENTS

| | | |
|---|---|---|
| JP | 2005-150675 | 6/2005 |
| WO | WO-2005/064666 | 7/2005 |

* cited by examiner

SEMICONDUCTOR LIGHT EMITTING DEVICE AND METHOD FOR MANUFACTURING THE SAME

TECHNICAL FIELD

The present invention relates to a semiconductor light emitting device having a plurality of protrusions at the top of a nitride system semiconductor stack and a method for manufacturing the semiconductor light emitting device.

BACKGROUND ART

There have been known nitride system semiconductor light emitting devices containing GaN and the like. For example, white LEDs, each of which is a combination of a blue LED (light emitting diode) containing GaN and an yellow light emitter, are widely used as backlights of liquid crystal displays (LCDs) of mobile phones and the like. Moreover, the white LEDs are characterized by low power consumption and long lifetime. Accordingly, the white LEDs will be further expected as light sources alternative to fluorescent and incandescent lamps in the future and are being increasingly studied and developed.

However, an LED outputs only about several watts and is therefore desired to increase in brightness. Conceivable means for increasing the brightness is increasing the internal quantum efficiency of the LED, increasing the extraction efficiency of extracting light emitted from an active layer to the outside, or the like. Since the light refractive index of GaN (about 2.5) is extremely higher than that of air (about 1.0) in particular, the total reflection angle at the interface between the LED and air is small, and the light extraction efficiency is very small (for example, about 10%).

Accordingly, various techniques to increase the efficiency of extracting light emitted by a semiconductor light emitting device are disclosed.

For example, Patent Literature 1 discloses a semiconductor light emitting device including a semiconductor stack with the surface of the top layer roughened.

This semiconductor light emitting device includes a semiconductor stack having a p-GaN layer provided, an active layer, and an n-GaN layer on a substrate. The upper surface of the n-GaN layer formed in the top layer of the semiconductor stack has conical protrusions formed to be roughened. Roughening the upper surface of the n-GaN layer as described above can prevent light emitted by the active layer from being reflected at the interface between the n-GaN layer and air by Snell's law, thus increasing the amount of light emitted to the outside.

In the method of manufacturing this semiconductor light emitting device, first, using MOCVD (metal organic chemical vapor deposition), the n-GaN layer, active layer, p-GaN layer are sequentially stacked on a growth substrate (a sapphire substrate) to form the semiconductor stack. Subsequently, a p-side electrode is formed on the p-GaN layer, and the semiconductor stack is then re-attached to a supporting substrate so that the p-side electrode is positioned on the supporting substrate (silicon substrate) side.

Next, on the upper surface of the n-GaN layer at the top of the semiconductor stack reattached to the supporting substrate, an n-side electrode is formed. Thereafter, the upper surface of the n-GaN layer is formed into a rough surface with conical protrusions by PEC (photo-enhanced chemical) etching using KOH solution and a xenon/mercury lamp.

Patent Literature 1

International Publication Pamphlet No. 2005/064666

DISCLOSURE OF THE INVENTION

Problems to be Solved by the Invention

However, depending on the refractive index of the n-GaN layer and wavelength of light emitted from the active layer, when the conical protrusions are small, the upper surface of the n-GaN layer acts on light in a same manner as a flat surface although the conical protrusions are formed. Accordingly, light is reflected on the upper surface of the n-GaN layer in the same manner as a flat surface, and the amount of reflected light is therefore increased. Accordingly, there is a problem of reduction in efficiency of extracting light to the outside.

The present invention was invented to solve the aforementioned problem, and an object of the present invention is to provide a semiconductor light emitting device with a light extraction efficiency increased and a method of manufacturing the semiconductor light emitting device.

Means for Solving the Problem

To achieve the aforementioned object, a semiconductor light emitting device according to the invention includes: a substrate; and a semiconductor stack which includes an active layer emitting light and is provided on the substrate, in which a single or a plurality of protrusions are formed in an upper surface of a semiconductor layer at a top of the semiconductor stack which emits light to the outside, and an average $W_A$ of widths of bottom surfaces of the protrusions satisfies $W_A >= \lambda/n$, where $\lambda$ is wavelength of light emitted from the active layer and n is a refractive index of the n-GaN layer of the semiconductor layer at the top.

According to an aspect of the invention, the semiconductor layer at the top is an n-GaN layer.

According to another aspect of the invention, the protrusions are conical shaped.

According to still another aspect of the invention, a method for manufacturing a semiconductor light emitting device includes a stacking step of forming a semiconductor stack including an active layer on a growth substrate; a re-attachment step of re-attaching the semiconductor stack to a supporting substrate; and a surface roughening step of immersing the semiconductor layer at a top of the semiconductor stack into a KOH (potassium hydroxide) solution while irradiating the semiconductor layer with UV (ultraviolet) light to form a single or a plurality of protrusions and thus roughen a surface of the semiconductor layer at the top. In the surface roughening step, the protrusions are formed to have an average $W_A$ of widths of bottom surfaces of the protrusions satisfying $W_A >= \lambda/n$ where $\lambda$ is wavelength of light emitted from the active layer and n is a refractive index of the n-GaN layer of the semiconductor layer at the top.

According to a further aspect of the invention, in the surface roughening step, shapes of the protrusions are determined based on a concentration of the KOH solution.

Effect of the Invention

According to the present invention, by forming the protrusions satisfying the above equation on the upper surface of the semiconductor layer at the top so as to allow light emitted by the active layer to be easily transmitted through the semiconductor layer at the top, most of the light emitted by the active layer is not reflected on the upper surface of the semiconductor layer at the top, which is an interface between the semiconductor layer at the top and air, and can be emitted to the outside. This can increase the light extraction efficiency and thus increase the brightness of the semiconductor light emitting device.

EXPLANATION OF REFERENCE NUMERALS

1. SEMICONDUCTOR LIGHT EMITTING DEVICE
2. SUPPORTING SUBSTRATE
3. p-SIDE ELECTRODE
4. REFLECTION LAYER
4A. METAL LAYER
5. MASK LAYER
5A. CONTACT HOLE
6. SEMICONDUCTOR STACK
7. n-SIDE ELECTRODE
11. ZnO ELECTRODE
12. p-GaN LAYER
13. MQW ACTIVE LAYER
14. n-GaN LAYER
14A. PROTRUSION
20. GROWTH SUBSTRATE

BEST MODE FOR CARRYING OUT THE INVENTION

Figure 1:
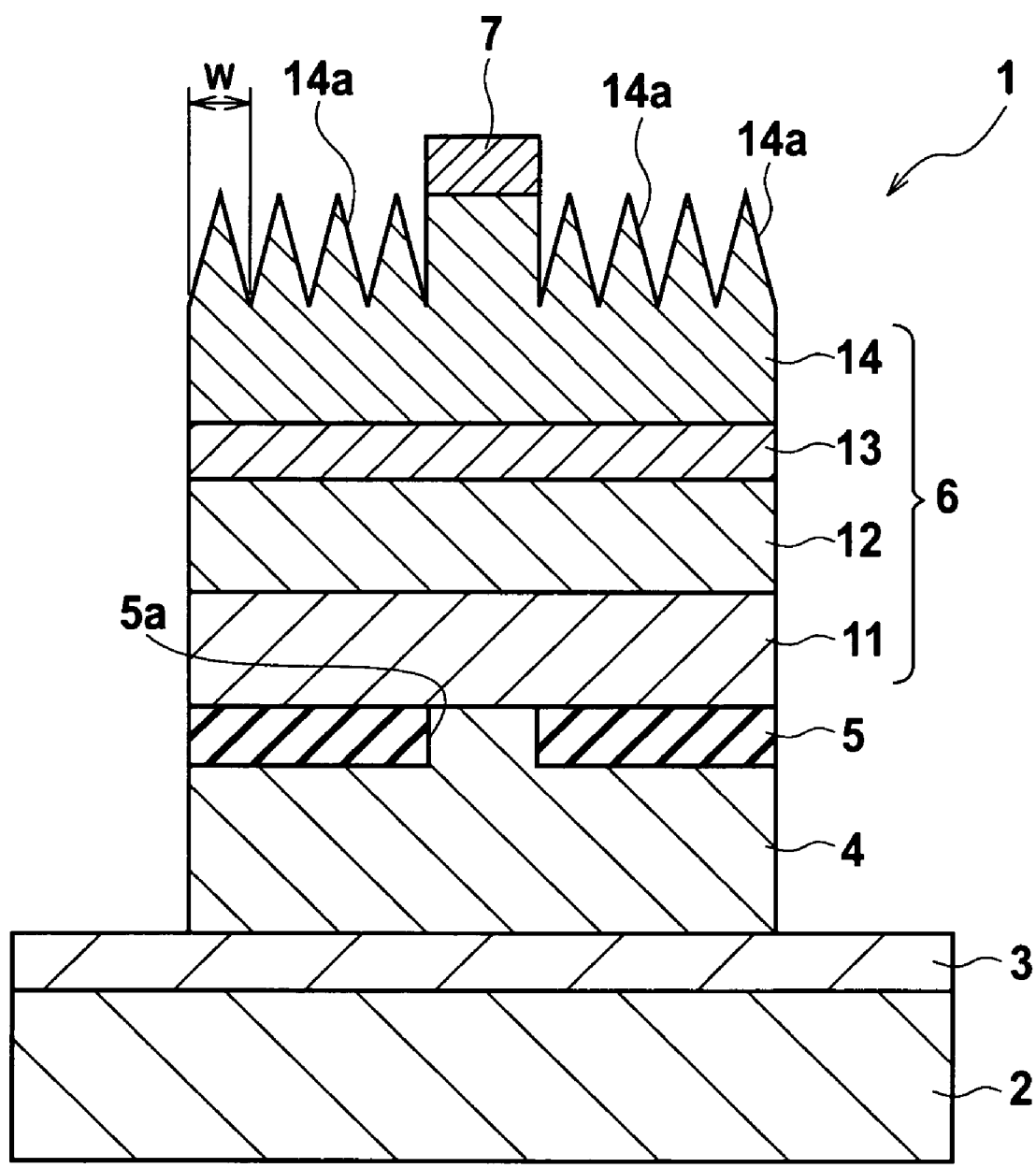
FIG. 1 shows a cross-sectional structure of a semiconductor light emitting device according to the present invention.
Figure 2:
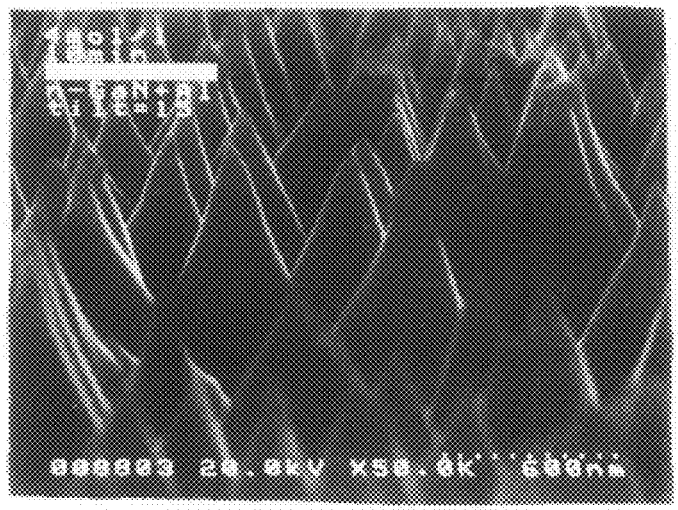
FIG. 2 is an electron micrograph of a plurality of protrusions formed in n-GaN layer.
Figure 3:
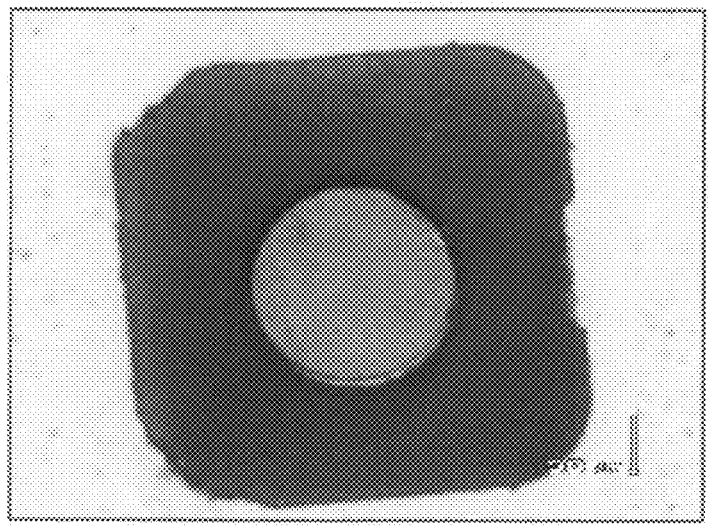
FIG. 3 is an optical micrograph (bright field image) of the semiconductor light emitting device taken from above.

Hereinafter, a description is given of an embodiment of the present invention with reference to the drawings. FIG. 1 shows a cross-sectional structure of a semiconductor light emitting device according to the present invention. FIG. 2 is an electron micrograph of a plurality of protrusions formed in an-GaN layer. FIG. 3 is an optical micrograph (a bright field image) of the semiconductor light emitting element taken from above.

As shown in FIG. 1, a semiconductor light emitting device (light emitting diode) 1 includes a supporting substrate 2, a p-side electrode 3, a reflection layer 4, a mask layer 5, a semiconductor stack 6, and an n-side electrode 7.

The supporting substrate 2 is composed of a substrate with high heat radiation, such as a Cu substrate or an AlN substrate. The p-side electrode 3 is formed across an entire surface of the supporting substrate 2. The p-side electrode 3 is composed of Au—Sn or Au.

The reflection layer 4 includes an Au layer, a Pt layer, a Ti layer, and an Al layer sequentially stacked from the supporting substrate 2 side. The Al layer may be replaced with another silver-gray metal layer such as an Ag layer. The reflection layer 4 is connected to a ZnO electrode 11 of the semiconductor stack 6 through a contact hole 5a formed in the mask layer 5.

The mask layer 5 functions as an etching mask at etching of the semiconductor stack 6 in a later-described manufacturing step. The mask layer 5 is composed of a dielectric film of $SiO_2$ or the like or a resist film.

The semiconductor stack 6 is supported on the supporting substrate 2 with the p-side electrode 3, reflection layer 4, and mask layer 5 interposed therebetween. The semiconductor stack 6 includes the ZnO electrode 11, a p-GaN layer 12, an MQW active layer 13, and an n-GaN layer 14.

The ZnO electrode 11 has a low resistivity of about $2\times10^{-4}$ Ωcm and a thickness of about 1000 to 20000 Å. Desirably, the thickness of the ZnO electrode 11 is about 8000 Å.

The p-GaN layer 12 is doped with Mg as a p-type dopant. Between the p-GaN layer 12 and MQW active layer 13, an undoped GaN layer or an InGaN layer containing about 1% In.

The MQW active layer 13 includes eight $In_XGa_{1-X}N$ well layers (not shown) about 30 Å thick and eight undoped $In_YGa_{1-Y}N$ barrier layers (not shown) about 100 Å thick alternately arranged on each other. Herein, X and Y satisfy the following equations: $0<=X<=0.3$ (desirably $0.1<=X<=0.2$), $0<=Y<=0.1$, and $Y<=X$. Between the MQW active layer 13 and n-GaN layer 14, an InGaN/GaN superlattice layer doped with Si (not shown) is formed. The n-GaN layer 14 is doped with Si as an n-type dopant.

As shown in FIGS. 1 and 2, in the upper surface of the n-GaN layer 14, a plurality of conical (pyramid-shaped) protrusions 14a are formed. Herein, an average $W_A$ of widths W of the bottom surfaces of the conical protrusions 14a satisfies:

$$W_A >= \lambda/n \qquad (1)$$

where λ is wavelength of light emitted from the MQW active layer 13 and n is the refractive index of the n-GaN layer 14.

For example, in the case of the blue semiconductor light emitting device 1 having an InGaN layer emitting light with a peak wavelength of 460 nm as the well layer, the refractive index of the n-GaN layer 14 is about 2.5, and therefore the above average $W_A$ is not less than about 184 nm. In the case of the blue semiconductor light emitting device 1 having a GaN layer emitting light with a peak wavelength of 365 nm as the well layer, the above average $W_A$ is not less than about 146 nm.

Herein, as apparent from the micrograph of FIG. 3, the image of the periphery where the conical protrusions 14a satisfying the above equation (1) are formed is black, and the periphery is therefore found to transmit light. On the other hand, the image of the center part where the protrusions satisfying the equation (1) are not formed is white, and the center part is therefore found to reflect light.

The n-side electrode 7 is formed to cover a part of the n-GaN layer 14. The n-side electrode 7 includes Al/Ti/Au or Al/Mo/Au stacked from the n-GaN layer 14 side.

As described above, in the semiconductor light emitting device 1 according to the present invention, the conical protrusions 14a satisfying the equation (1) are formed in the upper surface of the n-GaN layer 14 so as to easily transmit light emitted by the MQW active layer 13. Accordingly, most of the light emitted by the MQW active layer 13 is not reflected at the upper surface of the n-GaN layer 14 as an interface of the n-GaN layer 14 and air and emitted to the outside. This can increase the light extraction efficiency and therefore increase the brightness of the semiconductor light emitting device 1.

Next, a description is given of a method for manufacturing the aforementioned semiconductor light emitting device with reference to the drawings. FIGS. 4 to 8 are views each showing a cross sectional structure of the semiconductor light emitting device at each manufacturing step.

First, a growth substrate 20 composed of a sapphire substrate side is conveyed to a growth chamber. Next, the temperature inside the growth chamber is increased to about 1050° C. while hydrogen gas continues to be supplied to the growth chamber for thermal cleaning of the growth substrate 20.

Figure 4:
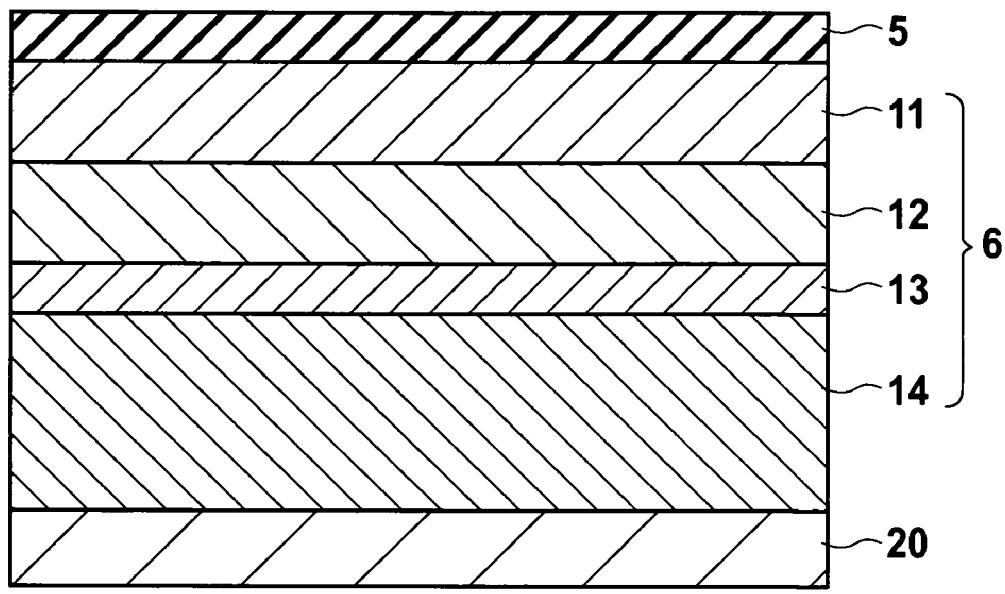
FIG. 4 is a view showing a cross-sectional structure of the semiconductor light emitting device in a manufacturing step according to a method for manufacturing a semiconductor light emitting device of the present invention.

Next, as shown in FIG. 4, the temperature of the growth chamber is reduced to about 600° C., and a GaN buffer layer (not shown) is grown on the growth substrate 20 using MOCVD. The temperature of the growth chamber is then increased to about 1000° C., and the n-GaN layer 14 doped with Si, the InGaN/GaN superlattice layer doped with Si, and the undoped GaN layer or InGaN layer containing about 1% In are sequentially stacked.

The temperature of the growth chamber is then increased for growth of the p-GaN layer 12. Next, in order to convert the p-GaN layer 12 into p-type, annealing is performed to activate Mg in the p-type GaN layer 12. Next, using molecular beam epitaxy (MBE), the ZnO electrode 11 is formed (a stacking step). Thereafter, the mask layer 5 made of $SiO_2$ is formed.

Figure 5:
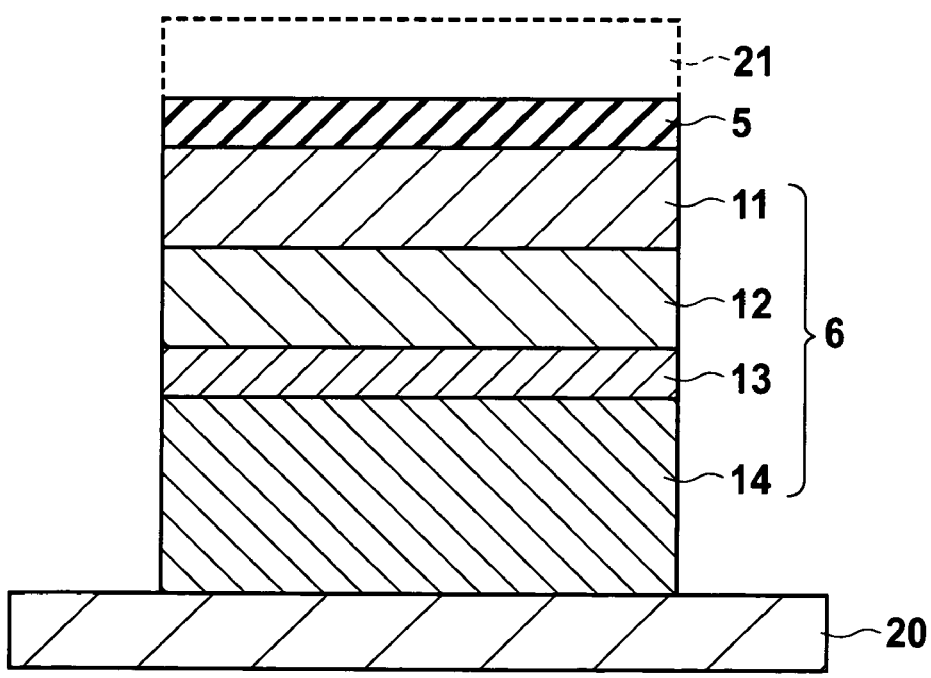
FIG. 5 is a view showing a cross-sectional structure of the semiconductor light emitting element in another manufacturing step according to the method of manufacturing a semiconductor light emitting device of the present invention.

Next, as shown in FIG. 5, a resist film 21 is formed by photolithography. The mask layer 5 is then patterned by etching using the resist film 21 as a mask, and then the resist film 21 is removed.

Next, the ZnO electrode 11 to n-GaN layer 14 are mesa-etched up to the growth substrate 20 by inductively-coupled plasma (ICP) etching using the mask layer 5 as a mask. The mesa-etching may be performed after the ZnO electrode 11 is patterned and the mask layer 5 made of $SiO_2$ is formed.

Figure 6:
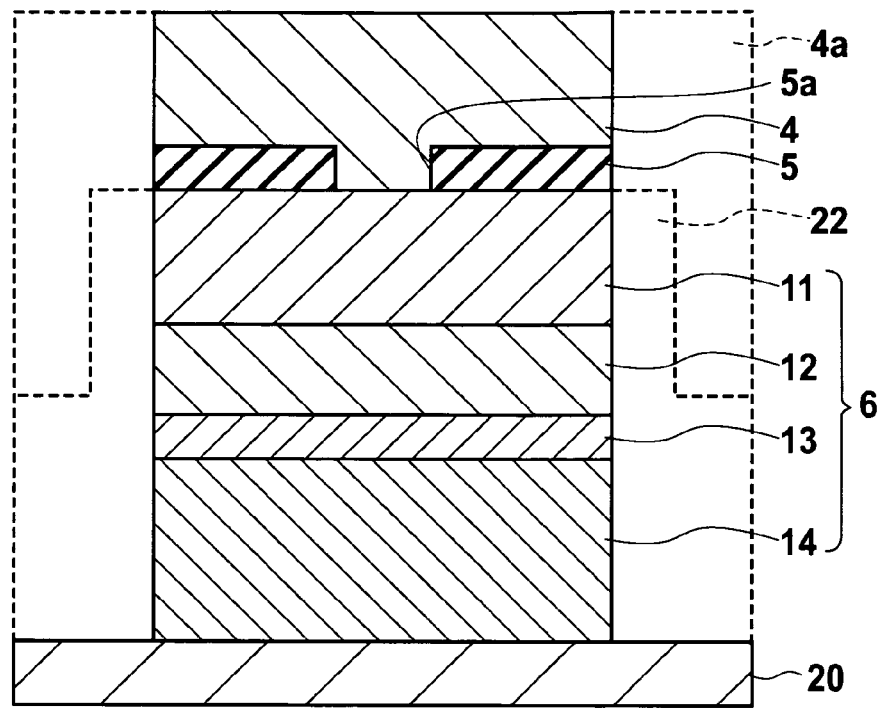
FIG. 6 is a view showing a cross-sectional structure of the semiconductor light emitting element in still another manufacturing step according to the method of manufacturing still another semiconductor light emitting device of the present invention.

Next, as shown in FIG. 6, the mask layer 5 is etched using dry etching with $CF_4$ to form the contact hole 5a to connect the reflection layer 4 and ZnO electrode 11.

Herein, the ZnO electrode 11 is hardly etched by $CF_4$ and therefore serves as an etching stopper. Next, a resist film 22 is formed, and Al or Au is deposited thereon. Thereafter, Ti/Pt/Au are sequentially layered. Next, the metal layer 4a on the resist film 22 is removed together with the resist film 22 to form the reflection layer 4.

Figure 7:
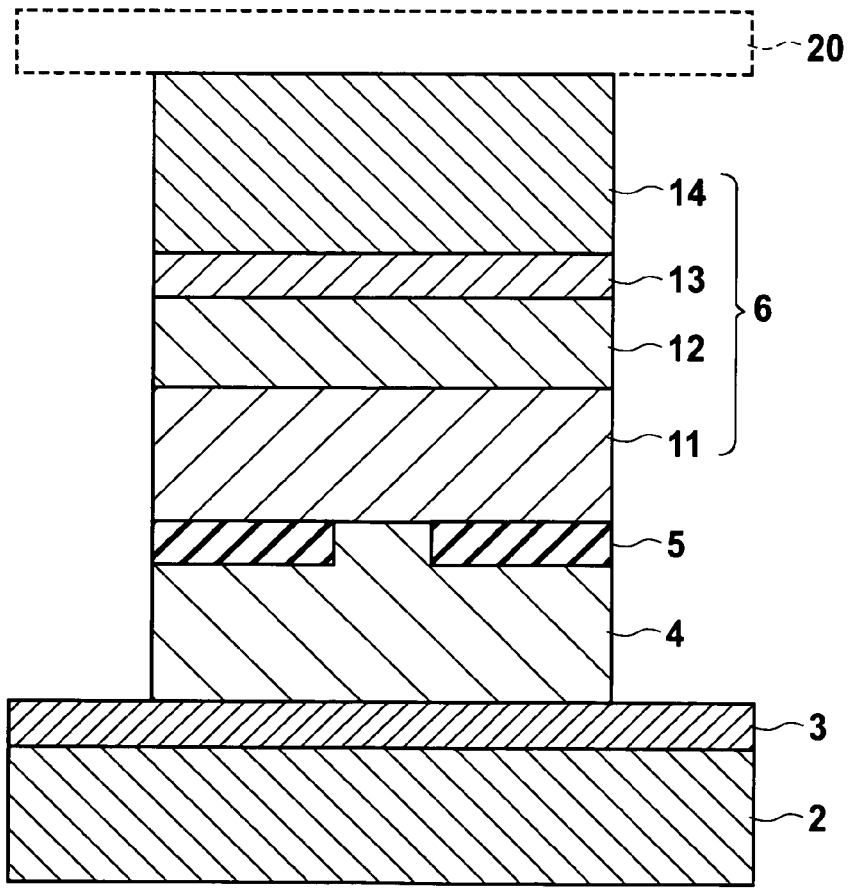
FIG. 7 is a view showing a cross-sectional structure of the semiconductor light emitting element in still another manufacturing step according to the method of manufacturing a semiconductor light emitting device of the present invention.

Next, as shown in FIG. 7, the p-side electrode 3 of Au—Sn or Au is formed on the supporting substrate 2, and the semiconductor stack 6 is attached to the support substrate 2 by thermocompression bonding so that the p-side electrode 3 and reflection layer 4 are bonded to each other.

Thereafter, a beam from a KrF laser oscillating at about 248 nm is projected from the growth substrate 20 side to the n-GaN layer 14. The beam of the KRF laser is substantially completely transmitted through the growth substrate 20 as the sapphire substrate and is substantially fully absorbed by the n-GaN layer 14. The temperature at the interface (the GaN buffer layer) between the growth substrate 20 and n-GaN layer 14 therefore rapidly increases to fuse the n-GaN layer 14 and GaN buffer layer near the interface. The growth substrate 20 can be thus lifted off (a laser lift off (LLO) process: a re-attachment step).

Herein, energy of the KrF laser required to lift off the growth substrate 20 is about 300 to 700 $mJ/cm^2$. $N_2$ generated when the n-GaN layer 14 is fused escapes to the adjacent semiconductor stack 6, and the semiconductor stack 6 is affected by pressure, thus preventing cracks of the semiconductor stack 6. After the growth substrate 20 is separated, unnecessary Ga droplets remaining on the upper surface of the n-GaN layer 14 are removed by etching with an acid, an alkali, or the like.

Figure 8:
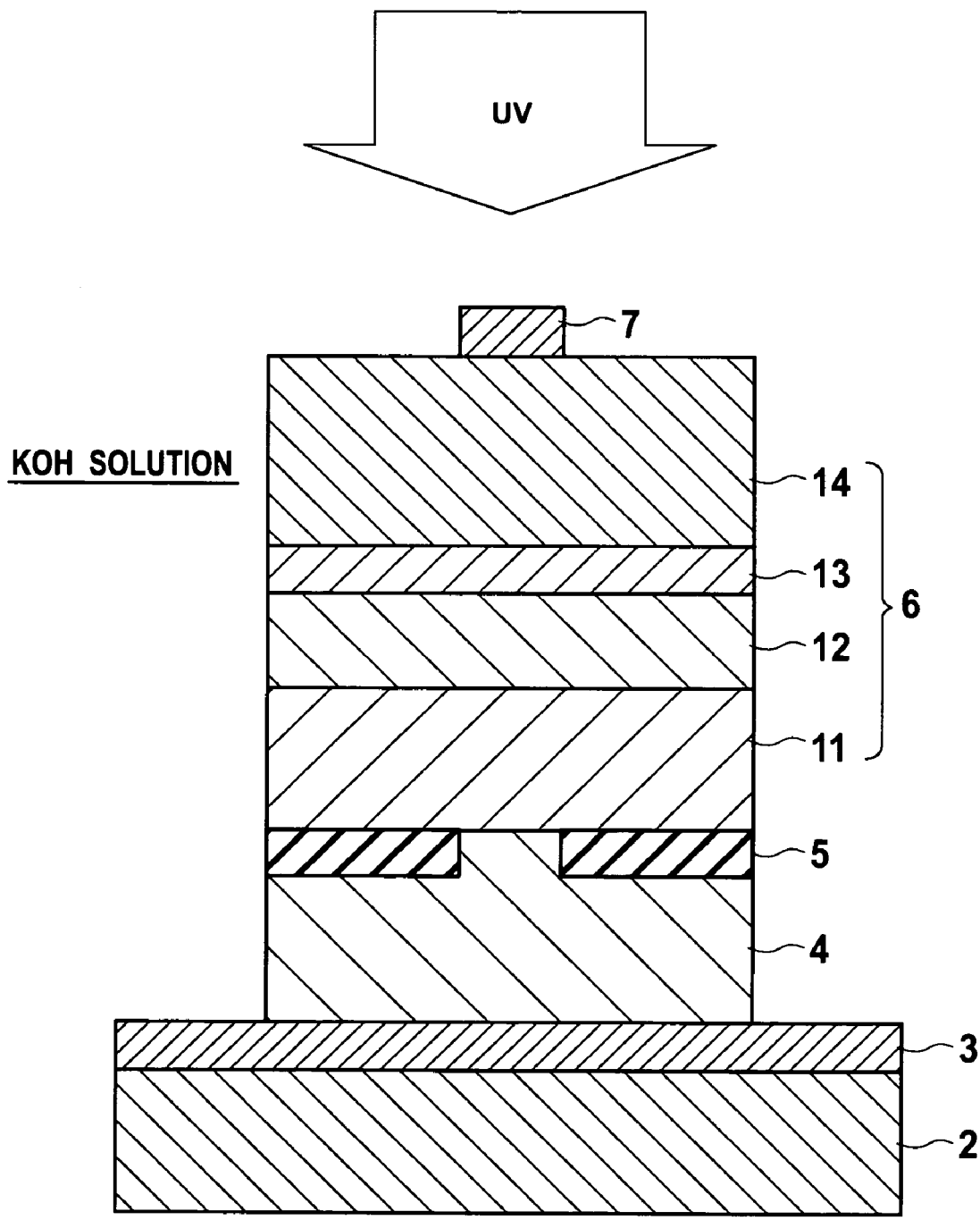
FIG. 8 is a view showing a cross-sectional structure of the semiconductor light emitting element in a still another manufacturing step according to the method of manufacturing a semiconductor light emitting device of the present invention.

Next, a resist film (not shown) is formed, and a metal layer (not shown) composed of Al/Ti/Au or Al/Mo/Au is stacked. Thereafter, as shown in FIG. 8, the metal layer is patterned using a lift off process to form the n-side electrode 7 allowing wire bonding on a part of the upper surface of the n-GaN layer 14.

Herein, the upper surface of the n-GaN layer 14 with the growth substrate 20 removed is not composed of a Ga polar face but an N polar face tending to have anisotropy by etching. In this state, the n-GaN layer 14 is immersed in about 4 mol/l KOH solution at about 62° C. and is exposed to ultra violet (UV) light of about 3.5 $W/cm^2$ for 10 minutes as shown in FIG. 8, thus forming the plurality of conical protrusions whose average $W_A$ of the widths W of the bottom surfaces satisfies the equation (1) in the upper surface of the n-GaN layer 14 (photo enhanced chemical etching (PEC) (a surface roughening step)).

The average of aspect ratios (height/bottom width) of the conical protrusions 14a formed in the above conditions is about 1.5. Herein, when the molar concentration of the KOH solution is about 2.0 mol/l, the aspect ratio is about 1.0. The conical shapes of the protrusions 14a can be therefore defined by changing the molar concentration of the KOH solution in such a manner.

The semiconductor light emitting device 1 is thus completed.

Hereinabove, the present invention is described using the embodiment, but it is apparent to those skilled in the art that the present invention is not limited to the embodiment described in the specification. The present invention can be carried out as modified and changed modes without departing from the spirit and scope of the invention defined by the description of claims. Accordingly, the description of this specification is for illustrative purposes and does not impose any limitation on the present invention. A description is given below of modified modes obtained by partially changing the embodiment.

For example, the protrusions 14a are formed into conical shapes in the above embodiment but may be formed into shapes each being elongated in any one direction and having a trapezoidal cross section.

Moreover, the above embodiment includes the plurality of protrusions 14a formed in the upper surface of the n-GaN layer 14 in the above embodiment but may include only a single protrusion formed in the n-GaN layer.

In the above embodiment, the LLO process is performed using the KrF laser but may be performed using another exima laser (ArF: about 193 nm in wavelength, XeCl: about 308 nm in wavelength, YAG 3rd harmonic wave: about 355 nm in wavelength, sapphire-titanium $3^{rd}$ harmonic wave: about 360 nm in wavelength, or He—Cd: about 325 nm in wavelength).

Materials and the like constituting the semiconductor stack 6 and both electrodes 3 and 7 can be properly changed.

The parameters in the manufacturing process of the semiconductor stack 6 can be properly changed.

What is claimed is:

1. A semiconductor light emitting device, comprising:
a substrate;
a semiconductor stack which includes an active layer emitting light and is provided on the substrate; and
a ZnO electrode provided below a p-GaN semiconductor layer at a bottom of the semiconductor stack,
wherein a single or a plurality of protrusions are formed in an upper surface of an n-GaN semiconductor layer at a top of the semiconductor stack which emits light to the outside,
an average $W_A$ of widths of bottom surfaces of the protrusions satisfies $W_A \geq \lambda/n$, where $\lambda$ is wavelength of light emitted from the active layer and n is a refractive index of the n-GaN semiconductor layer at the top of the semiconductor stack, and
an upper surface of each of the single or the plurality of protrusions is conical shaped.

2. The device of claim 1, further comprising:
a reflection layer provided between the substrate and the ZnO electrode.

3. The device of claim 2, wherein
the reflection layer is connected to the ZnO electrode of the semiconductor stack through a contact hole formed in a mask layer provided between the reflection layer and the ZnO electrode.

4. A semiconductor light emitting device, comprising:
a substrate;
a semiconductor stack which includes an active layer emitting light and is provided on the substrate;
an n-GaN semiconductor layer at a top of the semiconductor stack which emits light to the outside; and
a ZnO electrode provided below a p-GaN semiconductor layer at the bottom of the semiconductor stack,
wherein a single or a plurality of protrusions are formed in an upper surface of the n-GaN semiconductor layer at the top of the semiconductor stack, and
an average $W_A$ of widths of bottom surfaces of the protrusions satisfies $W_A \geq \lambda/n$, where $\lambda$ is wavelength of light emitted from the active layer and n is a refractive index of the n-GaN semiconductor layer at the top of the semiconductor stack.

5. The device of claim 4, further comprising:
a reflection layer provided between the substrate and the ZnO electrode.

6. The device of claim 5, wherein
the reflection layer is connected to the ZnO electrode of the semiconductor stack through a contact hole formed in a mask layer provided between the reflection layer and the ZnO electrode.

* * * * *